United States Patent [19]

Slavin et al.

[11] Patent Number: 5,398,455
[45] Date of Patent: Mar. 21, 1995

[54] GRINDING TOOL

[75] Inventors: Thomas P. Slavin, Rocky Hill; James D. Campbell, Cromwell, both of Conn.

[73] Assignee: United Technologies Corporation, Hartford, Conn.

[21] Appl. No.: 6,273

[22] Filed: Jan. 14, 1993

[51] Int. Cl.6 .................................. B24D 3/00
[52] U.S. Cl. ...................... 451/540; 51/293; 51/309; 451/546; 451/544; 451/548; 451/552
[58] Field of Search ........... 51/204, 206 R, 206 NF, 51/207, 209 R, 211 R, 293, 295, 297, 307, 309

[56] References Cited

U.S. PATENT DOCUMENTS

| | | | |
|---|---|---|---|
| 4,266,449 | 5/1981 | Bielby | 76/101 A |
| 4,394,170 | 7/1983 | Sawaoka et al. | 51/307 |
| 4,797,138 | 1/1989 | Komanduri | |
| 4,919,974 | 4/1990 | McCune et al. | 51/293 |
| 4,951,427 | 8/1990 | St. Pierre | |
| 5,075,181 | 12/1991 | Quinto et al. | |
| 5,106,392 | 4/1992 | Slutz et al. | 51/293 |
| 5,139,537 | 8/1992 | Julien | |
| 5,141,901 | 8/1992 | Brandt | 51/309 |
| 5,211,726 | 5/1993 | Slutz et al. | 51/293 |
| 5,231,060 | 7/1993 | Brandt | 51/309 |

Primary Examiner—Maurina T. Rachuba
Attorney, Agent, or Firm—Charles E. Sohl

[57] ABSTRACT

A hafnium nitride coating is applied over the cubic boron nitride layer of conventional CBN tools by the process of arc physical-vapor-deposition at temperatures below the tempering temperature of the core metal. The hafnium nitride coating protects the cubic boron nitride or diamond abrasive and the core, resulting in a grinding tool with greater strength and longer life.

7 Claims, 1 Drawing Sheet

GRINDING TOOL

TECHNICAL FIELD

The technical field of this development relates to machining and cutting tools such as grinding wheels with cubic boron nitride (CBN) or diamond superabrasive particles adhered to the grinding surface. More specifically, it relates to coatings for the particles and grinding surface.

BACKGROUND ART

Abrasive substances for cutting, smoothing and polishing the surface of hard materials have developed their own niche in industry. Materials known for their high degree of hardness, such as diamonds and CBN, have long been used as the cutting edge of tools in grinding, sawing, lapping, machining and drilling. Typically, the working surface of a tool made of steel or other metallic substrate is coated with a layer of the harder, more abrasion-resistant material.

In one application, a titanium nitride coating is applied over conventional CBN tools by arc physical-vapor-deposition. The titanium nitride stabilizes and reinforces the existing bond between the CBN and the core, resulting in a grinding tool with greater efficiency and longer life. Specific operating conditions, however, are required during the deposition process in order to ensure the proper level of adhesion of the titanium nitride. See U.S. Pat. No. 5,139,537.

A need still remains for even more improved grinding wheels. More sophisticated metals and a demand for even more precise grinding require better wheels.

DISCLOSURE OF INVENTION

We have developed superabrasive grinding wheels for machining applications which demand extreme wheel speeds and material removal rates. We apply a coating of hafnium nitride or hafnium carbide to the metallic matrix or bond material of the wheel to reduce the level of interaction between the matrix material and the material being ground. In superabrasive grinding, extremes of temperature are encountered, temperatures at which significant reactions can occur between the metal being ground and the metal in the wheel. We have found a thin hafnium coating eliminates the metal bonded wheel's surface porosity, decreases friction between the wheel and cut chips (reduces wheel loading) reduces erosion of the bond matrix thus preventing abrasive loss, and increases heat removal from the workpiece to the wheel.

BEST MODE FOR CARRYING OUT THE INVENTION

Figure 1:
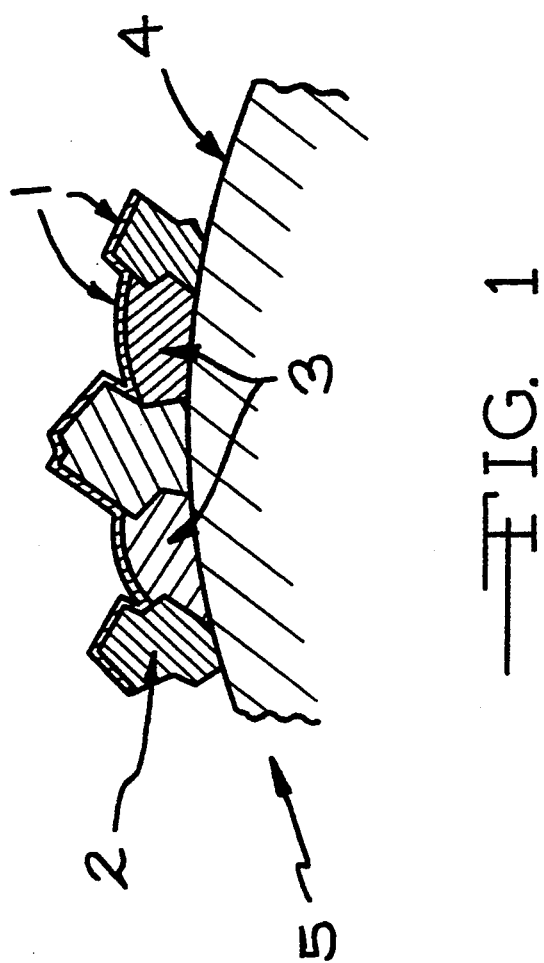
FIG. 1 is a partial, cross-sectional drawing of a grinding wheel showing the hafnium-based coating of the invention.

The hafnium nitride or hafnium carbide coating provides a superabrasive grinding wheel with an extended life and improved surface finishing capability.

FIG. 1 is a partial, cross-sectional view of grinding wheel 5 showing the hafnium coating. The drawing shows, hafnium-based coating 1, superabrasive crystals 2 (diamonds or CBN), electroplated or brazed metal 3 and grinding wheel core 4. Coating 1 is applied by physical vapor deposition or chemical vapor deposition after superabrasive grit 2 is electroplated or brazed to grinding wheel core 4. When a chip of material from a workpiece is formed by superabrasive crystal 2 it is pushed down the side of crystal 2 towards bonding metal 3. Hafnium-based coating 2 delays the erosion, cratering and undermining, of bonding metal 3. Hafnium-based coating 2' prevents chips of the metal being ground from eroding grinding wheel 5.

The thin film and coating target material typically depend on the material being ground. For example, we found hafnium nitride and hafnium carbide to be especially beneficial if titanium was to be ground. Depositing a thin coating of hafnium nitride or hafnium carbide on CBN grinding wheels greatly improved strength and reduced clogging with metal chips.

We accomplished deposition of hafnium-based on CBN wheels at relatively low temperatures with the arc physical-vapor-deposition process. As a result of the low temperatures used in the process, the metal substrate of the wheel is not subjected to conditions that might cause loss of hardness and distortion.

The physical-vapor-deposition process is based on the ionization of metallic hafnium produced by an electric arc in a low-pressure nitrogen atmosphere. Using hafnium as solid cathode material, the arc causes hafnium ions to leave the surface of the cathode. Accelerated with high energy by a voltage bias, the ions move toward the material to be coated. Hafnium ions react with free nitrogen in the atmosphere to form hafnium nitride and implant at very high speeds onto the substrate surface, resulting in a uniform thin layer of high adherence coating. The hafnium nitride protects and stabilizes the CBN already bonded to the grinding wheel and improves the abrasive properties of the wheel.

In the preferred embodiment of the invention, we coated CBN grinding wheels with a layer of hafnium nitride by arc physical-vapor-deposition at very low absolute pressure and under higher than normal bias voltages in a nitrogen atmosphere. Accordingly, a standard CBN wheel, of the kind commercially available, for example, as an electroplated Norton CBN-type 570 wheel, is first preheated to a temperature of about 450° to 475° F. in an arc evaporator chamber under vacuum. This is accomplished by intense hafnium ion bombardment at a high bias voltage (for example, 1,000 V was used with the arc evaporation process marketed by Multi-Arc Scientific Coatings of Rockaway, N.J., under the trademark "Ion bond," but it may vary, in ways that would be obvious to one skilled in the art, with different equipment). This causes the surface of the wheel to absorb much of the energy carried by the ions. After the part has been uniformly preheated, the chamber is flushed with nitrogen to produce a nearly pure nitrogen atmosphere. A vacuum is then applied to reduce the absolute pressure in the chamber to about 25 millitors. The arc deposition process is then carried out at a bias voltage of approximately 150 V (this voltage may similarly vary depending on the equipment used) to form hafnium nitride coating 4 to 6 microns in thickness. The coated wheel is then allowed to cool in the nitrogen atmosphere in the chamber before it is retrieved.

An acceptable degree of adhesion of the hafnium nitride coating to standard CBN wheels can be obtained at operating temperatures ranging between 400° and 600° F. (both for preheating and for deposition), with corresponding absolute pressures ranging between 30 and 10 millitors, respectively.

The hafnium nitride coated CBN wheels show a remarkable improvement over uncoated wheels and TiN coated wheels. Tested under the same operating conditions in the performance of common grinding tasks, on the average the hafnium wheels demonstrated a working life (defined as the time of utilization without failure) over seven (7) times greater than that of uncoated CBN wheels. When tested at greater than normal operating feed rates (such as 0.025 linear inches per minute, where the normal rate would be 0.002 inches per minute), the hafnium nitride coated wheels were used efficiently without failure while standard CBN wheels failed in short order. Moreover, it was found that the coated wheels could be run successfully at much slower speeds than acceptable with uncoated wheels (such as, for example, at 3,000 rpm where the normal speed would be 6,000 rpm). This, in turn, results in the availability of more power at the cutting face of the grinding machine which makes it possible to increase the linear feed rate. In addition, because the method of coating deposition can be controlled to produce a layer of uniform thickness within the tolerances allowed for most grinding applications, the coated wheels can be used without further trueing or conditioning.

The hafnium coated wheels also performed better than titanium nitride coated wheels. In similar tests, hafnium coated wheels performed two (2) times better than TiN-coated wheels.

The following examples illustrate the improvements observed in a comparison of coated versus uncoated CBN wheels.

EXAMPLE 1

Performed to illustrate the coated wheel's ability to grind at higher linear feed rates than permissible at a given speed for uncoated wheels or TiN coated wheels.

Type of Grinding Wheel: CBN 570, 60/80 Grit
Size of Grinding Wheel: 6.5"×0.75"
Grinding Machine: Springfield Grinder, Model 42
Part Machined: Inconel 718 Stator
Linear Feed Rate: 0.025 inches per minute
Grinding Wheel Speed: 3,000 rpm
Part Table Speed: 20 rpm The hafnium nitride coated wheel machined 192 parts to specification before showing wear.

The uncoated wheel failed after the third part was machined.

The titanium nitride coated wheel failed before 90 parts were machined.

We claim:

1. A grinding tool consisting essentially of:
   a hard core with a grinding surface;
   a layer of diamond or cubic boron nitride particles adhering to the grinding surface; and a coating of hafnium nitride or hafnium carbide covering the particles and grinding surface,
   wherein a bonding metal adheres the particles to the grinding surface and the hafnium-based coating also covers the bonding metal.

2. A grinding tool according to claim 1, wherein the hafnium-based coating is 3 to 6 microns in thickness.

3. A grinding tool according to claim 1, wherein the hafnium-based coating is hafnium nitride.

4. A grinding tool according to claim 1, wherein the particles are cubic boron nitride particles.

5. A grinding tool according to claim 1, wherein the hard core is a metallic core.

6. A grinding wheel consisting essentially of:
   a hard metallic core with a grinding surface;
   a coating of cubic boron nitride particles adhering to the grinding surface; and
   a coating of hafnium nitride covering the particles and grinding surface,
   wherein a bonding metal adheres the particles to the grinding surface and the hafnium coating also covers the bonding metal.

7. A grinding wheel according to claim 6, wherein the hafnium-based coating is 3 to 6 microns in thickness.

* * * * *